(12) United States Patent
Artioli et al.

(10) Patent No.: US 11,360,125 B2
(45) Date of Patent: Jun. 14, 2022

(54) DEVICE AND METHOD FOR DETECTING THE MASS CENTER OF A BEAM OF ELECTRIC CHARGES

(71) Applicant: ENEA—Agenzia Nazionale Per Le Nuove Tecnologie, L'energia E Lo Sviluppo Económico Sostenibile, Rome (IT)

(72) Inventors: Marcello Artioli, Bologna (IT); Simone Beozzo, Bologna (IT); Roberto Guida, Padua (IT)

(73) Assignee: ENEA—AGENZIA NAZIONALE PER LE NUOVE TECNOLOGIE, L'ENERGIA E LO SVILUPPO ECONOMICO, Rome (IT)

( * ) Notice: Subject to any disclaimer, the term of this patent is extended or adjusted under 35 U.S.C. 154(b) by 0 days.

(21) Appl. No.: 16/977,902

(22) PCT Filed: Mar. 6, 2019

(86) PCT No.: PCT/EP2019/055525
§ 371 (c)(1),
(2) Date: Sep. 3, 2020

(87) PCT Pub. No.: WO2019/170721
PCT Pub. Date: Sep. 12, 2019

(65) Prior Publication Data
US 2021/0072291 A1     Mar. 11, 2021

(30) Foreign Application Priority Data

Mar. 8, 2018  (IT) ................ 102018000003379

(51) Int. Cl.
*G01R 19/00* (2006.01)
*G01R 29/24* (2006.01)
*G01T 1/29* (2006.01)

(52) U.S. Cl.
CPC ......... *G01R 19/0061* (2013.01); *G01R 29/24* (2013.01); *G01T 1/2914* (2013.01)

(58) Field of Classification Search
CPC .... G01R 19/0061; G01R 29/24; G01T 1/2914
See application file for complete search history.

(56) References Cited

U.S. PATENT DOCUMENTS

2009/0295365 A1* 12/2009 Solar ..................... H05H 7/00
324/71.3
2015/0083928 A1* 3/2015 Reisgen ............. B23K 15/0013
250/397

FOREIGN PATENT DOCUMENTS

EP        0402124 A2   12/1990
JP        H04308696 A  10/1992

OTHER PUBLICATIONS

G Naylor et al, "Beam Position and Phase Measurements Using a FPGA for the Processing of the Pick-Ups Signals", Jan. 1, 2003. Retrieved from the Internet: URL:http://accelconf.web.cern.ch/AccelConf/d03/papers/PT01.pdf XP05515160.
(Continued)

*Primary Examiner* — Tung X Nguyen
*Assistant Examiner* — Feba Pothen
(74) *Attorney, Agent, or Firm* — Volpe Koenig

(57) ABSTRACT

A method for detecting the position of the mass center of a passing-through beam of electric charges in a duct, having a passage section with a plurality of detection faces directed thereto is presented. The method includes: arranging couples of detecting elements, so that each couple detects a space area divided into two half-areas by an intermediate plane between the detecting elements of the respective couple; obtaining, from each detecting element, a signal thereby produced representing the distance thereof from the mass center to be detected; comparing the signals produced by each detecting element, by obtaining a digital signal show-
(Continued)

ing the greater proximity of the mass center to one of the detecting element of the couple; and composing the digital signals produced by the couples of detecting elements, by identifying the cross-section of the beam of electric charges to which the mass center of the beam electric charges belongs.

14 Claims, 5 Drawing Sheets

(56) References Cited

OTHER PUBLICATIONS

P. Forck, P. Kowina, and D. Liakin, "Beam position monitors," CERN accelerator school on beam diagnostics, pp. 187-228, 2008.
S. R. Smith, "Beam position monitor engineering," in AIP Conf. Proc., 1996, vol. 390, N SLAC-PUB-7244 , pp. 50-65.

* cited by examiner

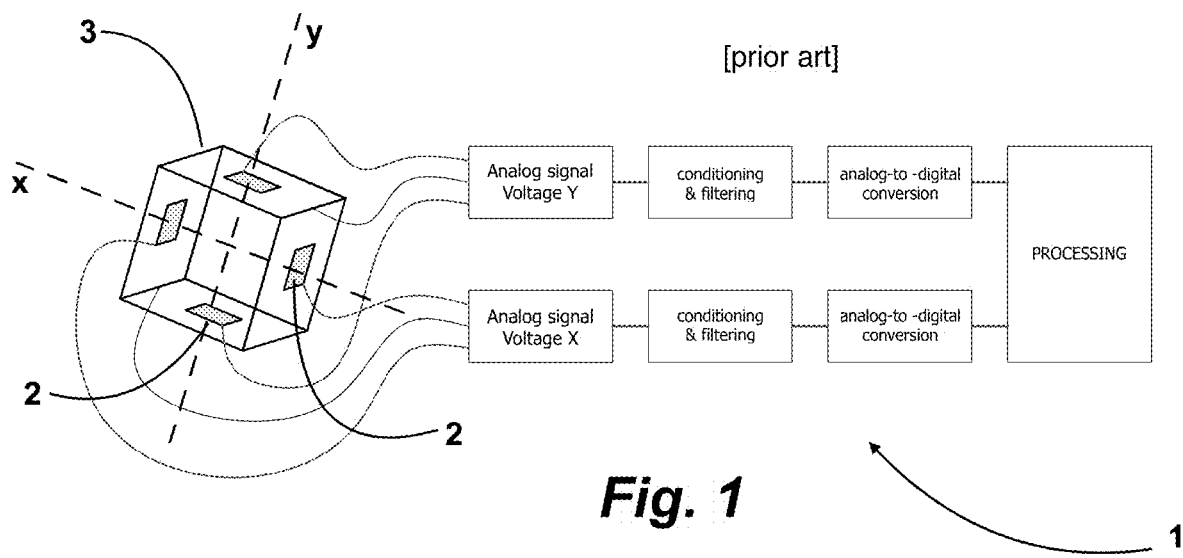
Fig. 1 [prior art]
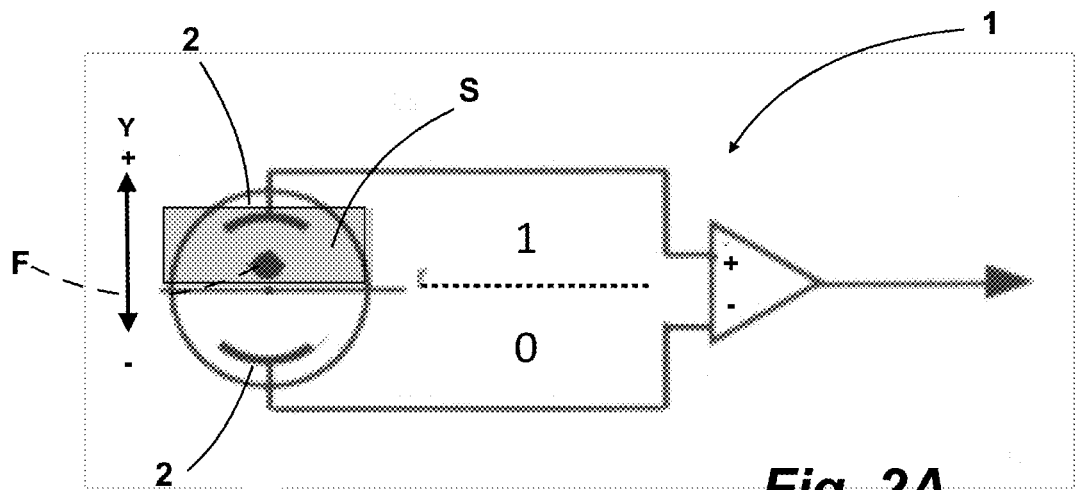
Fig. 2A
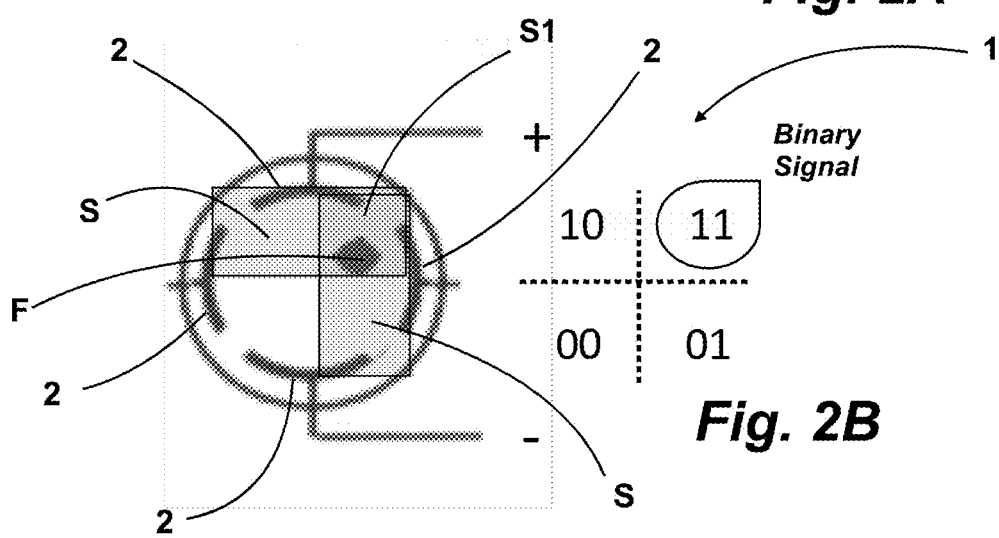
Fig. 2B

DEVICE AND METHOD FOR DETECTING THE MASS CENTER OF A BEAM OF ELECTRIC CHARGES

FIELD OF THE INVENTION

The present invention relates to a device and a method for detecting, in a beam of particles having an electric charge, in short electric charges, the mass center thereof, with the purpose of determining and adjusting the pointing of said beam on a target.

BACKGROUND

Various applications of beams of electric charges are known, which can be for example electrons or ions, such as protons H+ or carbon ions. By way of example, they can be used in imaging techniques or in therapeutic applications wherein a target, for example a tumor mass, is subjected to radiation with a beam of electrons or ions to cause the ablation thereof. Another application relates to the positioning of a beam of electric charges inside a synchrotron.

Generally, a device for detecting the mass center of a beam of electric charges has a passage section detected in a duct, which is under vacuum or ultra-vacuum conditions. The section then is limited by walls of any shape, for example implemented in a box-like structure: the faces are directed towards the passage direction, so that there are couples of opposite faces, i.e. directed one to another.

On said faces either electrodes are placed, or however capacitive reinforcing elements, or antennas with passive reception as well, constituting detecting elements capable of generating a signal, in particular an electrical, analog and substantially proportional signal, or however correlated to the amount of passing charge, which is assumed to be known, and to the distance thereof from the faces, which is the unknown value which has to be determined.

With reference to annexed FIG. 1 (prior art), a box-like structure 3 of this type is represented, with a schematic view and by way of example only, showing a functional block-scheme of a device for detecting the mass center of a beam of electric charges according to the known art: in the device 1 there are four faces opposed two by two, on each face there is at least an electrode 2 the analog signal thereof, typically an electric voltage, is read, filtered and in case converted to obtain a digital signal processable by a processor assigned to calculate the passage position of the beam, i.e. the spatial coordinates thereof. The steps of this processing process are represented in FIG. 1 by means of a block diagram.

In the device 1 of FIG. 1, the two couples of electrodes 2 arranged on opposite faces detect analogically the position of the beam along the axes detected by the line joining the detecting elements of the couple.

Depending upon the energy of the beam, its shape, frequency and type of application there are several methods with related detecting devices, the most important ones are: linear-cut, button, stripline, cavity, described for example in P. Forck, P. Kowina, and D. Liakin, "Beam position monitors," CERN accelerator school on beam diagnostics, pages 187-228, 2008; and S. R. Smith, "Beam position monitor engineering," in AIP Conf. Proc., 1996, volume 390, N. SLAC-PUB-7244, pages 50-65.

The first two methods, called linear-cut and button methods, are based upon the capacitive effect, therefore the transit of the packet of charges induces on the reinforcing elements of a condenser a charge which is image of the distance of the beam from each reinforcing element, which thus produces a current or a voltage to be detected instrumentally and to be processed, for example, as described with reference to FIG. 1.

The third method, called stripline method, is based upon the electromagnetic propagation, wherein the transit of the packet of electric charges is treated as a signal captured by several antennas arranged on the opposite faces of the device. The antennas, too, produce an analog signal which can be treated as above described.

These three methods use a differential measurement, therefore, for each one of the two (vertical and horizontal) axes, a couple of detectors, reinforcing elements, antenna electrodes are provided, each one thereof providing a coordinate on the respective axis.

The fourth method, called cavity method, instead, is based upon the electromagnetic resonance. Upon the transit of the packet in a resonant cavity, the width of the excitation caused in the cavity is proportional to the position of the beam and the horizontal and vertical position are read through two different polarizations in the cavity.

This fourth type of device, very precise even for small packets, is particularly sophisticated, but not suitable for big packets of electric charges.

European patent application EP 0,402,124 A2 discloses a method for detecting the position of the mass center of a passing-through beam of electric charges within a duct, which may be regarded as a close example of the above described prior art.

Japanese patent application N. JP H 04308696 A describes an analogue detecting device, based upon an electric method for researching the peak voltage, using a large number of detector couples.

In all cases, the measurement near the detectors is analogue, that is the signal collected by the detectors is suitably conditioned (with filtering and amplification) and it constitutes the measurement of the position, which is then conveniently converted into digital to be used by other devices.

Therefore, the mass center of the beam is localized with two detectors, one for the axis X and one for the axis Y, the readings thereof provide the coordinates of the center on the Cartesian plane of the transit section.

The reading takes place with electronic circuits the complexity thereof mainly depends upon the energy of the beam: beams with weak intensity require sensible apparatuses, immune to interferences. Moreover, such complexity is also influenced by the transit speed of the beam: short and quick beams require very quick electronics to be detected.

Therefore, different beams require different electronic apparatuses which however have to detect analogically a signal to transform it into a measurement to be translated in a spatial coordinate, since the quantity to be detected is continuous and it is a measurement of the distance on the two axes. It is meant that this operation mode then can require very highly complex apparatuses in order to meet the most advanced needs.

The technical problem underlying the present invention is to provide a device and a method for detecting the mass center of a beam of electric charges allowing to obviate the drawbacks mentioned with reference to the known art.

SUMMARY

Such problem is solved by a detecting method as above specified comprising a step of arranging, on said detection faces, a plurality of couples of detecting elements, so that each couple identifies a space area ideally divided into two half-areas by an intermediate plane between the detecting elements of the respective couple.

In each couple of detecting elements and from each detecting element, a signal is obtained which represents the distance thereof from the mass center of the beam of electric charges, but the value of this signal is not processed, as it has to be used only for a comparison between the signals produced by the detecting elements in each couple.

From this comparison, for each couple of detecting elements a binary signal is obtained showing the greater proximity of the mass center to one or to the other detecting element of the couple, i.e. that it belongs or does not belong to one of the half-areas corresponding to one or the other detecting element of the couple.

In a preferred version, each detecting element occupies an areola on the respective detection face, which can be approximated to a point, and all detecting elements belong to the same detection plane, which corresponds to the cross-section wherein the mass center of the beam of electric charges is determined.

In this way, the above-mentioned half-areas translate into half-planes belonging to the planar cross-section, and said intermediate plane translates into an intermediate axis.

In a preferred embodiment example, the detecting elements are equal to each other, so that said intermediate plane is equidistant from the detecting elements of the same couple.

Moreover, conveniently, the detecting elements of each couple are arranged on different detection faces; in a rectangular geometry, with opposite and two-by-two parallel detection faces, the detecting elements of each couple are arranged preferably on opposite faces, preferably by meeting a condition of axial symmetry with respect to the axis of the duct whereon the cross-section is detected.

It if further to be meant that different couples of detecting elements can have a detecting element in common: in this way, from the same number of detectors, for example eight, it is possible to obtain a higher number of couples, for example from four to sixteen.

At last, in the method according to the invention a step is provided wherein the combination of the binary signals produced by the couples of detecting elements of said plurality is performed, by detecting the cross-section of the beam of electric charges, resulting from the intersection of the half-areas, thereto the mass center of the electric charges of the beam belongs.

The detecting elements can be capacitive elements such as plate or button electrodes, or they can be constituted by antennas.

The invention is further implemented by a device for detecting the position of the mass center of a passing-through beam of electric charges in a duct, having a cross-section con a plurality of detection faces directed thereto, comprising:

a. a plurality of couples of detecting elements, the detecting elements thereof are arranged on said faces so that each couple detects a space area ideally divided into two half-areas by an intermediate plane between the detecting elements of the respective couple;

b. for each detecting element, a transmission line produced by each detecting element, representing the distance of the mass center to be detected by the detecting element;

c. comparing means, connected, for each couple of detecting elements, to the transmission lines of the respective detecting elements, capable of producing a binary signal showing the greater proximity of the mass center to one or to the other detecting element of the couple, i.e. that it belongs or does not belong to one of the half-areas corresponding to one or the other detecting element of the couple; and d. a processor arranged for composing the binary signals from the means for comparing the couples of detecting elements of said plurality, by identifying the cross-section of the beam of electric charges, resulting from the intersection of the half-areas, to which the mass center of the electric charges of the beam belongs.

The main advantage of the method and of the device for detecting the mass center of a beam of electric charges according to the present invention lies in the fact of allowing a simpler and more immediate processing of the signals produced by the detecting elements, even if produced by a great number thereof, by avoiding the treatment of analog signals.

BRIEF DESCRIPTION OF THE DRAWINGS

The present invention will be described hereinafter according to a preferred embodiment example, provided by way of example and not for limitative purposes, with reference to the enclosed drawings wherein:

FIG. 1 shows a functional scheme of a device for detecting the mass center of a beam of electric charges according to the known art;

FIGS. 2A and 2B illustrate a mode for the digital detection of the beam in a device represented schematically;

DETAILED DESCRIPTION OF THE PREFERRED EMBODIMENTS

With reference to the figures, a device for detecting the position of the mass center of a beam of electric charges is described which passes through a passage section of a duct belonging to a device using such beam. The device is designated as a whole with 1.

The duct, and then the device arranged on said passage section, is under vacuum conditions, and preferably under ultra-vacuum conditions.

It is meant however that the device could operate even with a gaseous atmosphere.

Figure 3:
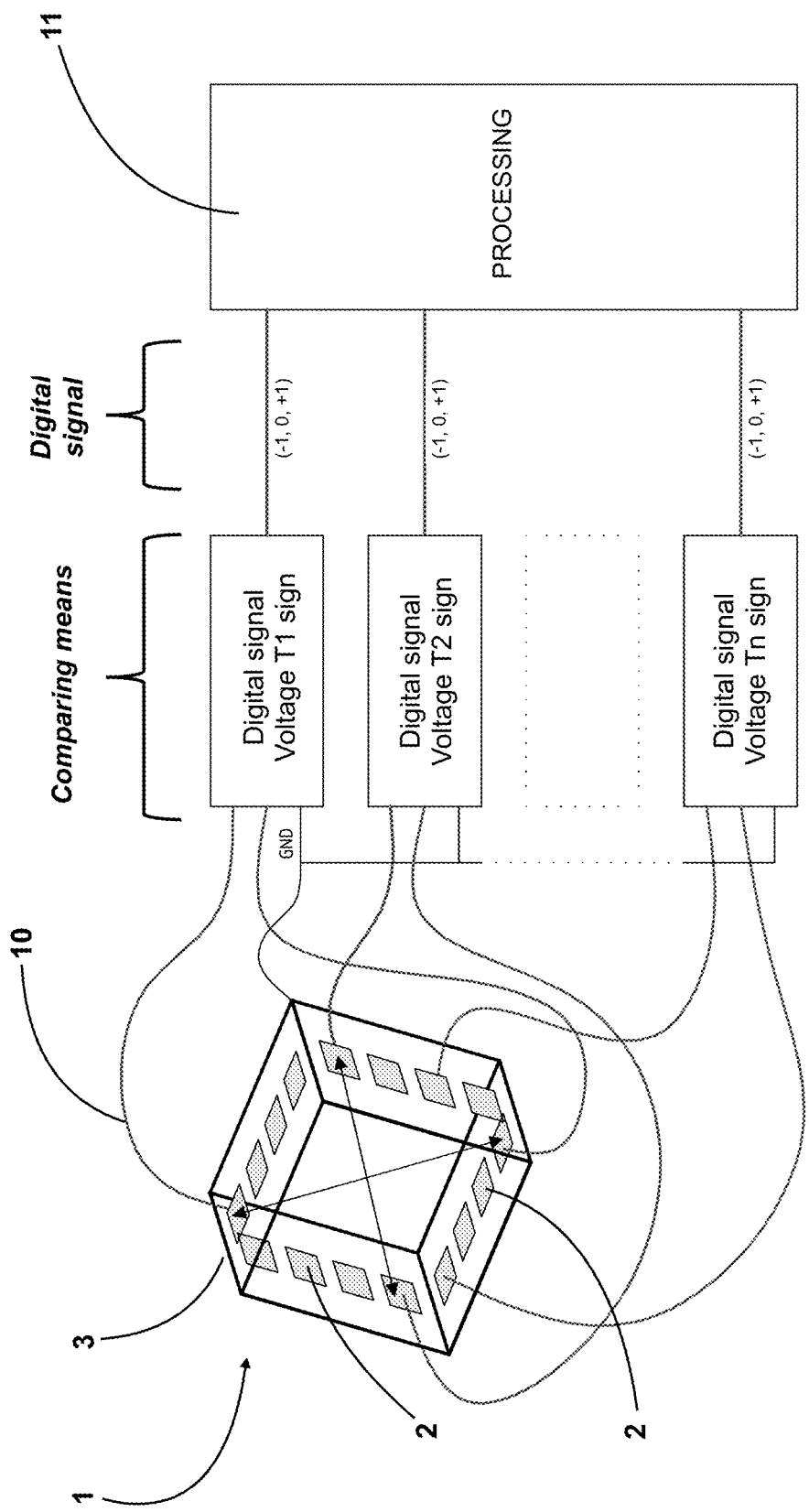
FIG. 3 shows a functional scheme of a device for detecting the mass center of a beam of electric charges according to the present invention.

In particular, the device 1 is represented schematically in FIG. 3. It is based upon a method for detecting said mass center which provides the use of detecting elements 2 of capacitive type or antenna type, however the value of the signal obtained therefrom is not used as direct measurement of the position, by means of an analogue reading (see FIG. 1), but only to obtain a binary signal 0 or 1 which provides a proximity or not proximity indication.

Therefore, the real position of the mass center of the beam is reconstructed through an algorithm requiring then a plurality of detecting elements 2 divided in couples.

By referring to FIG. 2A, the same couple of reinforcing elements can be used for extracting a reduced piece of information with respect to the previous case, by reading only the sign of such value, that is by discriminating only the reinforcing element which is in close proximity, without reading a measurement of the distance therefrom. In this case, the positive or negative sign, then translated in a digital, binary system (0, 1), will designate only the presence of the charges in one of the two half-planes detected in section by the axis equidistant from the reinforcing elements, in figure in the upper half-plane S.

The reading, then, starts already discretized and it makes useless the process and the electronic apparatus for measuring the signal intensity or width and the subsequent analogue-to-digital conversion.

The fact of placing several couples of reinforcing elements (FIG. 2B) allows to define several couples of half-planes S wherein the presence of the packet has to be checked. The intersection of the half-planes S1 allows to restrict the area of a cross-section wherein the packet is contained, and then to identify it with a precision which will depend upon the number and the placing of the couples of reinforcing elements.

Therefore, once known the coordinates and the equations of the axes of the half-planes in the Cartesian plane of the cross-section, it is possible to calculate mathematically the contour of the cross-section containing the packet.

As it will clearly appear hereinafter, such cross-section S1 can be made arbitrarily small by increasing the number of couples of half-planes with different axis, and in case by thickening the discretization of the cross-section near the center thereof, i.e. of the axis Z of the duct wherein the flow of electric charges passes.

Therefore, by referring to FIG. 3, the detection device 1, on the faces surrounding the passage section of a flow of electric charges the position thereof, i.e. the electric mass center thereof, one wants to know, comprises a plurality of couples of detecting elements 2, in the present example implemented by plate-like shaped electrodes, for example implemented by means of deposition of a metal layer on an insulating support. The faces, in turn, constitute a containment structure, in particular the already mentioned box-like structure 3.

The detecting elements 2 are arranged on said faces so that each couple detects a space area ideally divided into two half-areas by an intermediate plane between the same detecting elements 2 of each couple.

When the mass center of the beam falls nearer to one or the other detecting element 2 of a couple, it will find on one side or on the other side of said intermediate plane.

For each detecting element in each couple, a transmission line 10 of a signal produced by the detecting element 2 is provided.

Should a detecting element 2 belong to more than a couple of detecting elements, ideally it will be connected by a number of transmission lines equal to the number of couples wherein the detecting element is involved. However, it is meant that the lines could be, but they will not have to be, physically different, since the distinction between the different couples therein the detecting element participates can be obtained with a virtual switch during the reading of the signals.

The signals which each electrode produces represent the distance of the mass center to be detected by the detecting element. It is meant that, for each one of the couples taken into consideration, the comparison between the signals coming from the detecting elements will allow to identify to which intermediate half-area the mass center belongs, as seen in the examples of FIGS. 2A and 2B.

Therefore, the device 1, for each couple of detecting elements, comprises comparing means which is connected to the above-mentioned transmission lines 10 of the respective detecting elements 2.

Such comparing means (FIG. 3) performs the above-mentioned comparison between the signals, examination which, in case of capacitive reinforcing elements, translates into detecting the prevalence of a sign + or − in the resulting voltage T1, T2 . . . Tn, without the need that the analogue amount of the compared signal is read, filtered and translated in a measurement by the system.

Then, the comparing means substantially produces a binary signal (0, 1) or (+, −) showing the greater proximity of the mass center to one or to the other detecting element of the couple, i.e. that it belongs or does not belong to one of the half-areas corresponding to one or the other detecting element of the couple.

All these pieces of binary information are composed therebetween by a processor 11, which is arranged for this procedure for each one of the couples of detecting elements of said plurality of couples.

Figure 6A:
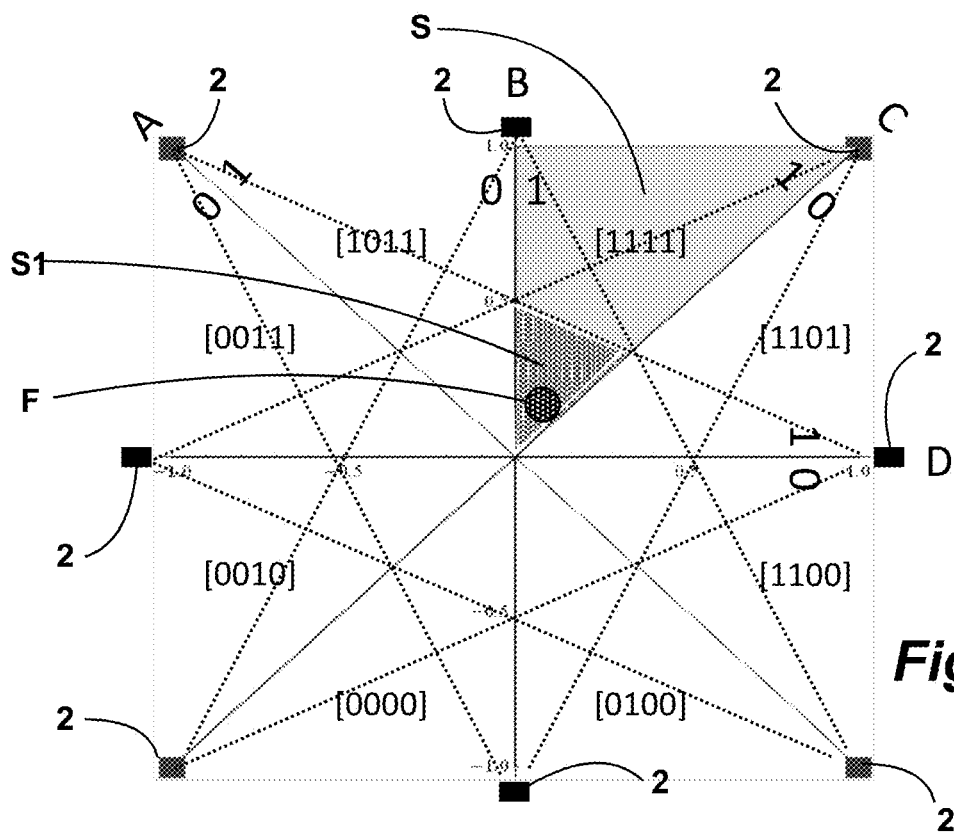
FIGS. 6A, 6B and 6C show the transit sections of the beam of charges and the position thereof in a device operating according to the detection method of the present invention, with an ever-increasing resolution.
Figure 6B:
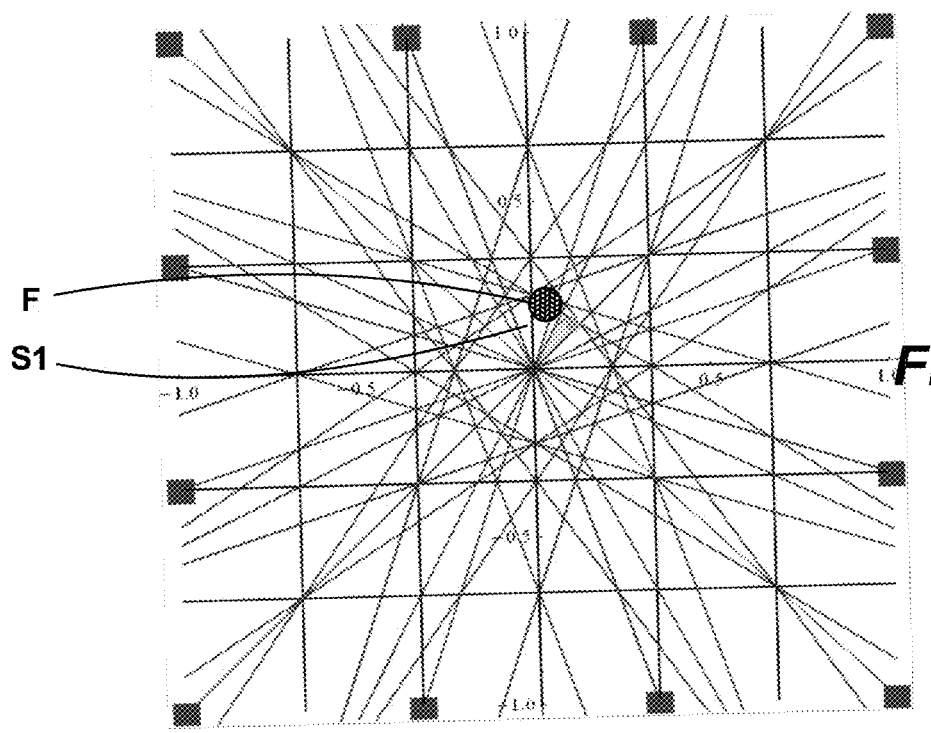
Figure 6C:
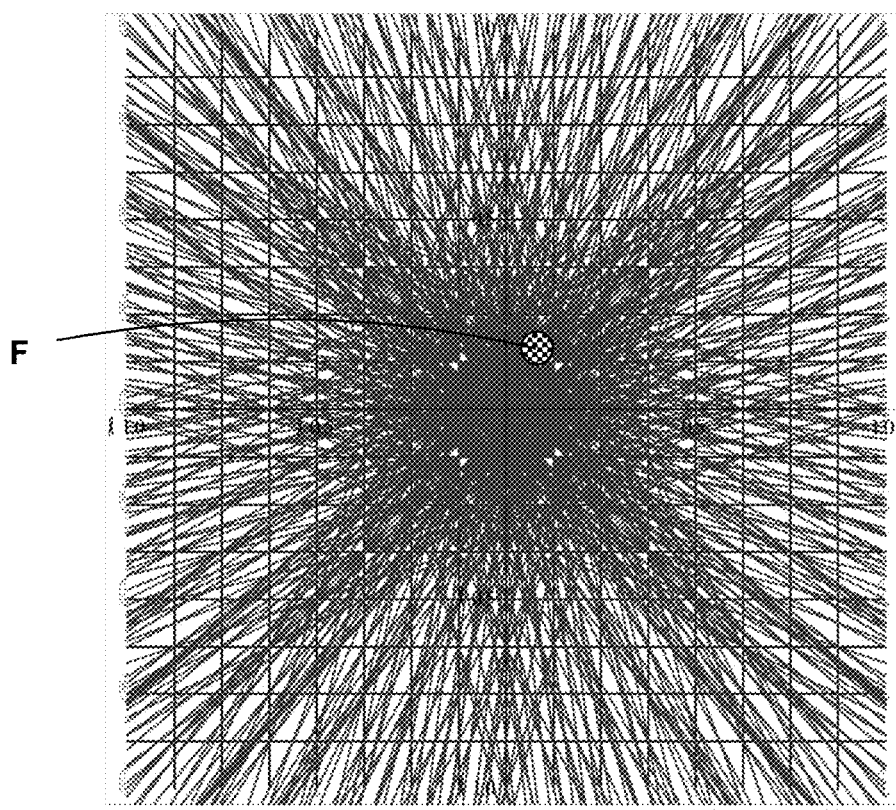

This composition implements the intersection between all half-areas S taken into consideration, for identifying the intersection, i.e. the cross-section, S1 wherein the mass center, designated with F in FIGS. 6A, 6B and 6C, falls.

Elementary examples of combination and intersection are shown in FIGS. 2B and 6A: the value 1 is assigned to the half-area S wherein the mass center F falls for each one of the intermediate planes A, B, C, D determined by the positioning of the detecting elements.

By taking into consideration the example of FIG. 2B, the intermediate planes are two, the intersection between the half-planes S wherein the mass center F falls produces a quarter of plane S1 which is identified by a double value 1: [11].

By referring to FIG. 6A, firstly the intermediate plane A of the couple of detecting elements at the ends of the axis C are taken into consideration; the intermediate plane B of the couple of detecting elements at the ends of the axis D; the intermediate plane C of the couple of detecting elements at the ends of the axis A; and the intermediate plane D of the couple of detecting elements at the ends of the axis B. Each couple produces a comparing signal having value 1 if the mass center F is nearer to a detecting element, the value is 0 for the other one: by composing all pieces of binary information a slice S detected by the string [1111] is obtained. FIG. 6A further shows the binary strings for the other areas separated by the axes A, B, C, D.

Secondly, it is possible to obtain new couples of detecting elements by using the already existing ones, but by adding different connections: additional pieces of binary information are thus produced allowing a refinement of the intersection obtained previously; the new intersection S1, smaller than the previous one, detects with greater precision the mass center F.

As it can be appreciated from FIGS. 6B and 6C, upon increasing the detecting elements and upon increasing the connections therebetween, thus determining additional couples, it is possible to finely discretize the cross-section, by thickening the possible intersections exactly at the axis Z of the cross-section.

The algorithm for reconstructing the position starting from the readings of the couples of electrodes in known position is based upon writing Cartesian equations which detect areas of the plane and logical connectors to determine the intersections thereof. It is described symbolically as follows.

There should be:
$e_i=(x_i, y_i)$ the coordinates of the general electrode,
$e_i^+$, $e_i^-$ i-th couple of electrodes,
$c=(c_x, c_y)$ the mass center of the beam,
and there should be defined:
$\lambda_i=\{(x,y)|y=m_i x+q_i\}$ the axis detected by the i-th couple of electrodes,
$\Pi_i^+=\{(x,y)|y>m_i x+q_i\}$ and
$\Pi_i^-=\{(x, y)|y<m_i x+q_i\}$ the half-planes detected by the axis $\lambda_i$
There should be calculated:

$$S(c, i) = \begin{cases} -1 & c \in \Pi_i^- \\ 0 & c \in \lambda_i \\ 1 & c \in \Pi_i^+ \end{cases} \quad (1)$$

the function of sensibility which discriminates the position of the mass center with reference to the i-th couple of electrodes,
and it should be determined:

$$\Gamma_i = \begin{cases} \Pi_i^- & S(c, i) = -1 \\ \lambda_i & S(c, i) = 0 \\ \Pi_i^+ & S(c, i) = 0 \end{cases} \quad (2)$$

the plane area wherein there is the mass center with reference to the i-th couple of electrodes,
then the mass center remains detected in the area $$\gamma = \bigcap_{i=1}^{n} \Gamma_i \quad (3)$$

Which can be made small at will upon increasing the number of couples n of electrodes.

In this analytical exposition, from each considered couple of detecting elements then a digital signal is obtained which thus can correspond not only to the more or less proximity to the electrodes, but even to the fact that the mass center belongs to the intermediate plane which separates the detecting elements, i.e. when the sensitivity of the system is not capable of distinguishing to which detecting element the mass center F is nearer.

The binary signal [0, 1] then is a particular case of the ternary digital signal [−1, 0, 1] illustrated in the analytical exposition of the used algorithm. Upon increasing the discretization and the sensibility of the detectors, the occurrence "0" becomes irrelevant, and the processor could discard it, then by using the binary signal.

It is to be noted that:
a. the operation implemented by the algorithm is distributive and associative and therefore two sets of n1 and n2 couples of electrodes can be combined to implement one single device of n1+n2 couples, by making the proposed solution modular and scalable;
b. there is no constraint about the arrangement of the electrodes therebetween or with respect to the beam, which can also be variable in time, provided that it is known at time of determining the sensibility function; and
c. the electrodes can be recombined to form additional different couples, by increasing the division in areas and then even the end resolution.

Figure 4:
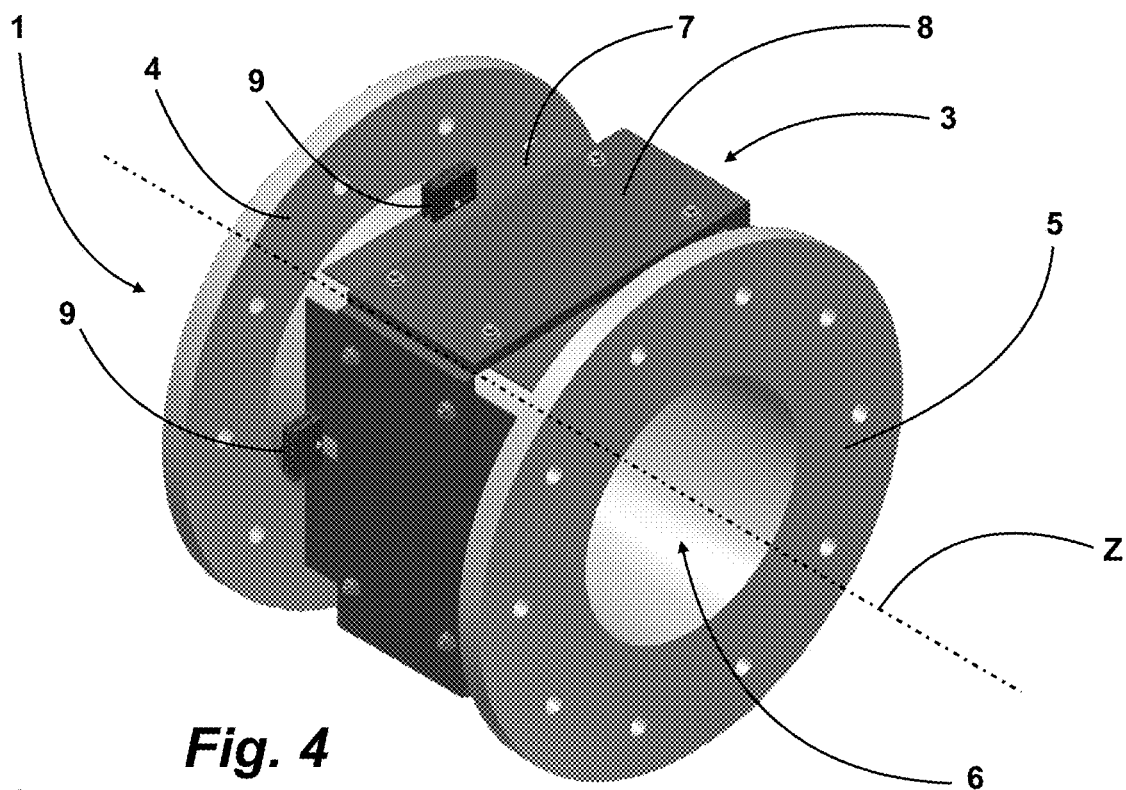
FIG. 4 shows an axonometric view of a device for detecting the mass center of a beam of electric charges according to the present invention.

By referring to FIG. 4, the device 1 comprises a box-like structure 3, with a flanged inlet 4 and a flanged outlet 5 which limit axially a tract of tube 6 or duct, generally made of ceramic material, inside thereof, generally under ultra-vacuum condition, the beam travels.

Said box-like structure 3 defines a plurality of uptake surfaces implemented on the faces of walls assembled in said box-like structure.

In the herein described example, the box-like structure 3 is of the type having four faces, opposed two by two with a substantially rectangular geometry. It is meant, however, that the herein described device could have different geometries from that of the present embodiment example.

Figure 5:
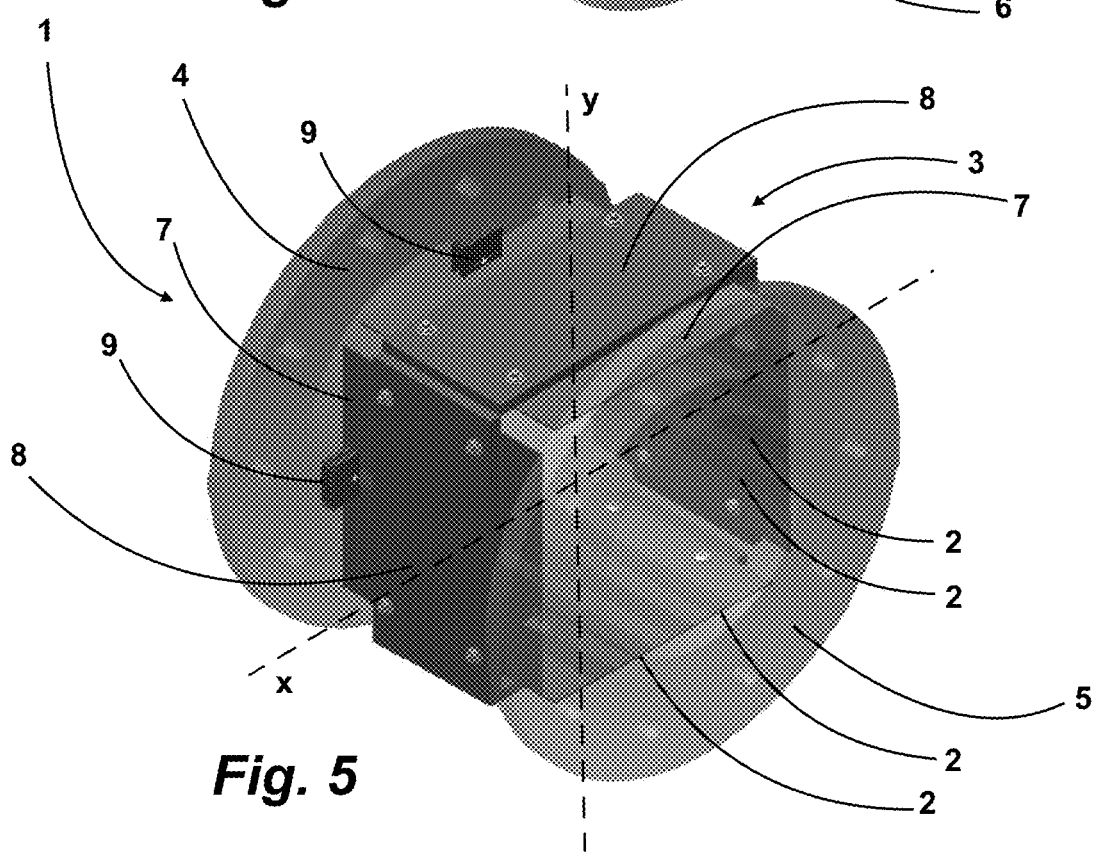
FIG. 5 shows a partially transparent view of the detection device of FIG. 4.

In the here illustrated example (FIGS. 4 and 5), the detecting elements 2 are assembled on the face of a board 7 directed towards outside the duct, for protection reasons, and the board constitutes an insulating support of the detecting element which can be a plate or button electrode, acting as condenser reinforcing element in combination with a small plate arranged on the opposite or however different surface.

In the present example, the board 7 is a printed circuit board, with the electrodes 2 implemented by means of suitable strip-like shaped metallization.

The boards 7 are fastened to supporting plates 8 which implement said box-like structure 3. Moreover, there are sockets 9 on each board, with a connecting pin for each detecting element 2; the connecting cables are not shown in order not to make the figures heavier.

It is highlighted that, differently from the traditional detectors, the electrodes and the terminal connectors are all wholly external to the tube wherein the beam travels, since the body made of ceramics is not shielding and the uptake can take place by crossing it. This avoids the need for through-wiring and improves vacuum sealing.

To the above-mentioned method and device for detecting the mass center of a beam of electric charges a person skilled in the arm, with the purpose of satisfying additional and contingent needs, could introduce several modifications and variants, all however within the protective scope of the present invention, as defined by the enclosed claims.

The invention claimed is:

1. A method for detecting the position of the mass center (F) of a passing-through beam of electric charges in a duct (6), having a passage section with a plurality of detection faces directed thereto, comprising the steps of:
arranging, on said detection faces (3), a plurality of couples of detecting elements (2), so that each couple detects a space area ($\Pi$) divided into two half-areas ($\Pi^+$, $\Pi^-$) by an intermediate plane ($\lambda_i$) between the detecting elements (2) of the respective couple;
in each couple of detecting elements, obtaining, from each detecting element (2), a signal representing a distance from each detecting element (2) to the mass center to be detected;
for each couple of detecting elements, comparing the signals, representing the distance, produced by each detecting element, by obtaining a digital signal showing the greater proximity of the mass center to one or to the other detecting element (2) of the couple, showing whether the mass center belongs or does not belong to one of the half-areas ($\Pi^+$, $\Pi^-$) corresponding to one or the other detecting element (2) of the couple, or whether the mass center belongs to said intermediate plane ($\lambda_i$);
composing the digital signals produced by the couples of detecting elements of said plurality, wherein an intersection (S1) of said half-areas of the plurality of couples of detecting elements (2), to which the detecting element (2) having said greater proximity belongs, is identified, to which the mass center (F) of the beam electric charges belongs.

2. The method according to claim 1, wherein the intermediate plane ($\lambda_i$) is equidistant from the respective detecting elements (2).

3. The method according to claim 1, wherein the detecting elements (2) of each couple are arranged on different faces, opposed in a rectangular geometry.

4. The method according to claim 1, wherein each detecting element (2) belongs to more than one of couple of detectors.

5. The method according to claim 1, wherein said digital signal is a binary [0,1] or ternary [−1,0,1] signal.

6. A device (1) for detecting a position of a mass center (F) of a passing-through beam of electric charges in a duct (6), having a passage section with a plurality of detection faces directed thereto, comprising:
- a plurality of couples of detecting elements (2), the detecting elements thereof being arranged on said faces so that each couple detects a space area (Π) divided into two half-areas ($\Pi^+$, $\Pi^-$) by an intermediate plane ($\lambda_i$) between the detecting elements (2) of the respective couple;
- wherein each detecting element (2) is linked to a corresponding transmission line (10) for transporting a signal, representing a distance, produced by each detecting element (2), representing a distance of the mass center (F) to be detected by the detecting element (2);
- wherein for each of said couples of detecting elements (2), one digital signal is obtained showing a greater proximity of the mass center to one or to the other detecting element of said each couple of detecting elements (2), and identifying, for each of said couples of detecting elements (2), the half-area ($\Pi^+$, $\Pi^-$) to which the detecting element (2) having said greater proximity belongs, or whether the mass center belongs to said intermediate plane ($\lambda_i$); and
- a processor (11) arranged for composing the digital signals, wherein a resulting intersection (S1) of the half-areas, of the plurality of couples of detecting elements (2) to which the detecting element (2) having said greater proximity belongs, is identified to which the mass center (F) of the beam electric charges belongs.

7. The device (1) according to claim 6, wherein the intermediate plane ($\lambda_i$) is equidistant from the respective detecting elements (2).

8. The device (1) according to claim 6, wherein the detecting elements (2) of each couple are arranged on different, opposed, faces.

9. The device (1) according to claim 6, wherein each detecting element (2) belongs to more than one of couple of detectors.

10. The device (1) according to claim 6, wherein the detecting elements (2) are selected from the group consisting of: detecting elements of capacitive type, electrodes, capacitive reinforcing elements, and antennas.

11. The device (1) according to claim 6, wherein the detecting elements (2) are implemented by means of deposition of a metal layer on an insulating support.

12. The device (1) according to claim 6, wherein said duct (6) is a tube made of ceramic material under vacuum or ultra-vacuum conditions.

13. The device (1) according to claim 6, wherein said faces belong to a box-like structure (3) having four faces, opposed two by two with a substantially rectangular geometry.

14. The device (1) according to claim 11, wherein said faces are implemented by means of respective printed circuit boards, wherein the detecting elements (2) are arranged outside the duct (6).

* * * * *